United States Patent
Chang et al.

(10) Patent No.: US 11,669,133 B2
(45) Date of Patent: Jun. 6, 2023

(54) DISPLAY PANEL AND DISPLAY APPARATUS

(71) Applicant: KunShan Go-Visionox Opto-Electronics Co., Ltd, Jiangsu (CN)

(72) Inventors: Miao Chang, Kunshan (CN); Lu Zhang, Kunshan (CN); Xiujian Zhu, Kunshan (CN); Siming Hu, Kunshan (CN); Zhenzhen Han, Kunshan (CN)

(73) Assignee: KUNSHAN GO-VISIONOX OPTO-ELECTRONICS CO., LTD, Kunshan (CN)

( * ) Notice: Subject to any disclaimer, the term of this patent is extended or adjusted under 35 U.S.C. 154(b) by 0 days.

(21) Appl. No.: 17/546,737

(22) Filed: Dec. 9, 2021

(65) Prior Publication Data

US 2022/0100240 A1 Mar. 31, 2022

Related U.S. Application Data

(63) Continuation of application No. PCT/CN2020/087237, filed on Apr. 27, 2020.

(30) Foreign Application Priority Data

Sep. 12, 2019 (CN) .......................... 201921526082.8

(51) Int. Cl.
*G06F 1/16* (2006.01)
*H01L 27/12* (2006.01)

(52) U.S. Cl.
CPC ........ *G06F 1/1686* (2013.01); *H01L 27/1214* (2013.01)

(58) Field of Classification Search
CPC .. G09G 3/3659; G09G 3/3611; G09G 3/3607; G09G 3/2085; G09G 2300/0465;
(Continued)

(56) References Cited

U.S. PATENT DOCUMENTS

2014/0191256 A1* 7/2014 Park .................. H01L 33/58
438/29
2016/0079333 A1* 3/2016 Shishido ............ G09G 3/3659
257/72

(Continued)

FOREIGN PATENT DOCUMENTS

CN 107610635 A 1/2018
CN 108364957 A 8/2018
(Continued)

OTHER PUBLICATIONS

International Search Report dated Jul. 17, 2020, in PCT Application No. PCT/CN2020/087237, 11 pages (with English Translation).

*Primary Examiner* — Shaheda A Abdin
(74) *Attorney, Agent, or Firm* — Maier & Maier, PLLC

(57) ABSTRACT

A display panel including a first display area, a second display area and a third display area. The second display area surrounds at least a part of the first display area and is located between the first display area and the third display area; the second display area includes a plurality of first groups of driving transistors and a plurality of second groups of driving transistors, the first groups of driving transistors include driving transistors for driving pixel units of the first display area, the second groups of driving transistors include driving transistors for driving pixel units of the second display area. The second groups of driving transistors and the first groups of driving transistors are alternately arranged, and a number and relative positions of the second groups of driving transistors adjacent to each first group of driving transistors are the same.

20 Claims, 6 Drawing Sheets

(58) Field of Classification Search
CPC .......... G09G 2300/08; G02F 1/134336; G02F 1/136277; G02F 1/13624; G02F 1/136286; G02F 1/134309; G02F 2201/52; H01L 27/326; H01L 27/3244; H01L 27/3218; H01L 27/1255; H01L 27/3262; H01L 27/3276; H01L 33/62; H01L 27/3211; H01L 27/01; H01L 27/3248; H01L 27/3213; H01L 27/124; H01L 27/3216; H01L 27/323
See application file for complete search history.

(56) References Cited

U.S. PATENT DOCUMENTS

| | | | |
|---|---|---|---|
| 2017/0170200 A1* | 6/2017 | Ikeda | H01L 27/124 |
| 2018/0342572 A1* | 11/2018 | Park | H01L 27/3276 |
| 2019/0096966 A1 | 3/2019 | Rappoport et al. | |

FOREIGN PATENT DOCUMENTS

| | | | |
|---|---|---|---|
| CN | 108389879 A | 8/2018 |
| CN | 108769304 A | 11/2018 |
| CN | 110009993 A | 7/2019 |
| CN | 209070895 U | 7/2019 |
| CN | 110112200 A | 8/2019 |

\* cited by examiner

DISPLAY PANEL AND DISPLAY APPARATUS

CROSS REFERENCE TO RELATED APPLICATION

The application is a continuation of International Application No. PCT/CN2020/087237 filed on Apr. 27, 2020, which claims the priority to Chinese Patent Application No. 201921526082.8, filed on Sep. 12, 2019 and entitled "DISPLAY PANEL AND DISPLAY APPARATUS", both of which are incorporated herein by reference in their entireties.

TECHNICAL FIELD

The application relates to the field of display technology, and particularly to a display panel and a display apparatus.

BACKGROUND

With development of display technology, users have higher and higher requirements for a screen of a display apparatus. The display apparatus may need to be installed with components such as a camera, an earpiece, and a sensing unit. At the current stage, a display area may be set on the display apparatus, and the components such as the camera, the earpiece, and the sensing unit may be installed under the display area.

However, under influence of various factors, uneven brightness may appear in the display area and thus a display effect may be reduced.

SUMMARY

Embodiments of the present application provide a display panel and a display apparatus.

In an aspect, an embodiment of the present application provides a display panel including a first display area, a second display area and a third display area. The second display area surrounds at least a part of the first display area and is located between the first display area and the third display area. A light transmittance of the first display area is higher than a light transmittance of the second display area and a light transmittance of the third display area. The second display area includes a plurality of first groups of driving transistors and a plurality of second groups of driving transistors. The first groups of driving transistors include driving transistors for driving pixel units of the first display area, and the second groups of driving transistors include driving transistors for driving pixel units of the second display area. The second groups of driving transistors and the first groups of driving transistors are alternately arranged, and a number and relative positions of the second groups of driving transistors adjacent to each first group of driving transistors are the same.

In another aspect, an embodiment of the present application provides a display apparatus including an apparatus body having a device area; and the above-described display panel covering the apparatus body. The device area is located under the first display area, and a photosensitive device for emitting or collecting light through the first display area is provided in the device area.

The embodiments of the present application provide a display panel and a display apparatus. A plurality of first groups of driving transistors and a plurality of second groups of driving transistors are provided in the second display area of the display panel. The second groups of driving transistors and the first groups of driving transistors are alternately arranged so that the number and relative positions of the second groups of driving transistors adjacent to each first group of driving transistors are the same. That is, a surrounding environment of each driving transistor for driving the pixel unit in the first display area is the same, so that a parasitic capacitance of each driving transistor for driving the pixel unit in the first display area tends to be the same or is the same, thereby reducing or eliminating brightness difference in the first display area and improving the display effect of the display panel.

DETAILED DESCRIPTION

Figure 1:
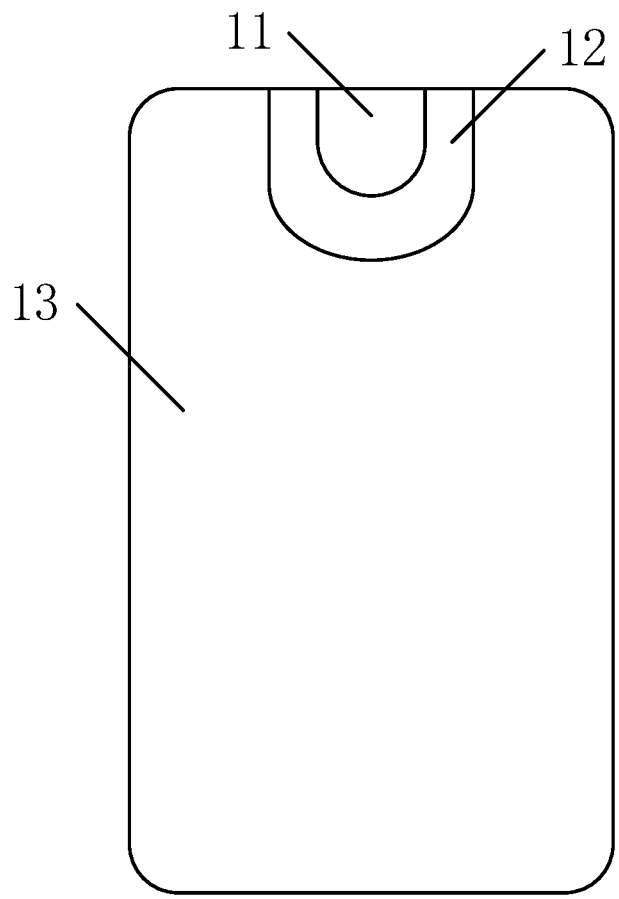
FIG. 1 is a schematic diagram of each display area of a display panel in an embodiment of the present application.

The features and exemplary embodiments of various aspects of the present application will be described in detail below. In the following detailed description, many specific details are proposed in order to provide a comprehensive understanding of the application. However, it is obvious to those skilled in the art that the application can be implemented without some of these specific details. The following description of the embodiments is only to provide a better understanding of the application by showing examples of the application, and is not intended to limit the protection scope of the application. In the drawings and the following description, well-known structures and technologies are not shown in order to avoid unnecessary obscurity of the application.

An embodiment of the present application provides a display panel. As shown in FIG. 1, the display panel includes a first display area 11, a second display area 12 and a third display area 13. The second display area 12 surrounds at least a part of the first display area 11 and is located between the first display area 11 and the third display area 13. A light transmittance of the first display area 11 is higher than a light transmittance of the second display area 12 and a light transmittance of the third display area 13. A photosensitive device such as a front camera, a fiber optic sensor and the like may be arranged at the first display area 11 to realize a full-screen display of an electronic device while ensuring that the photosensitive device can work normally.

During a display process of the display panel, the brightness of sub-pixels in pixel units in the first display area 11 may be different, resulting in the display of Mura. However, the display panel provided by the embodiment of the present application can solve the above-mentioned problem very well.

Figure 2:
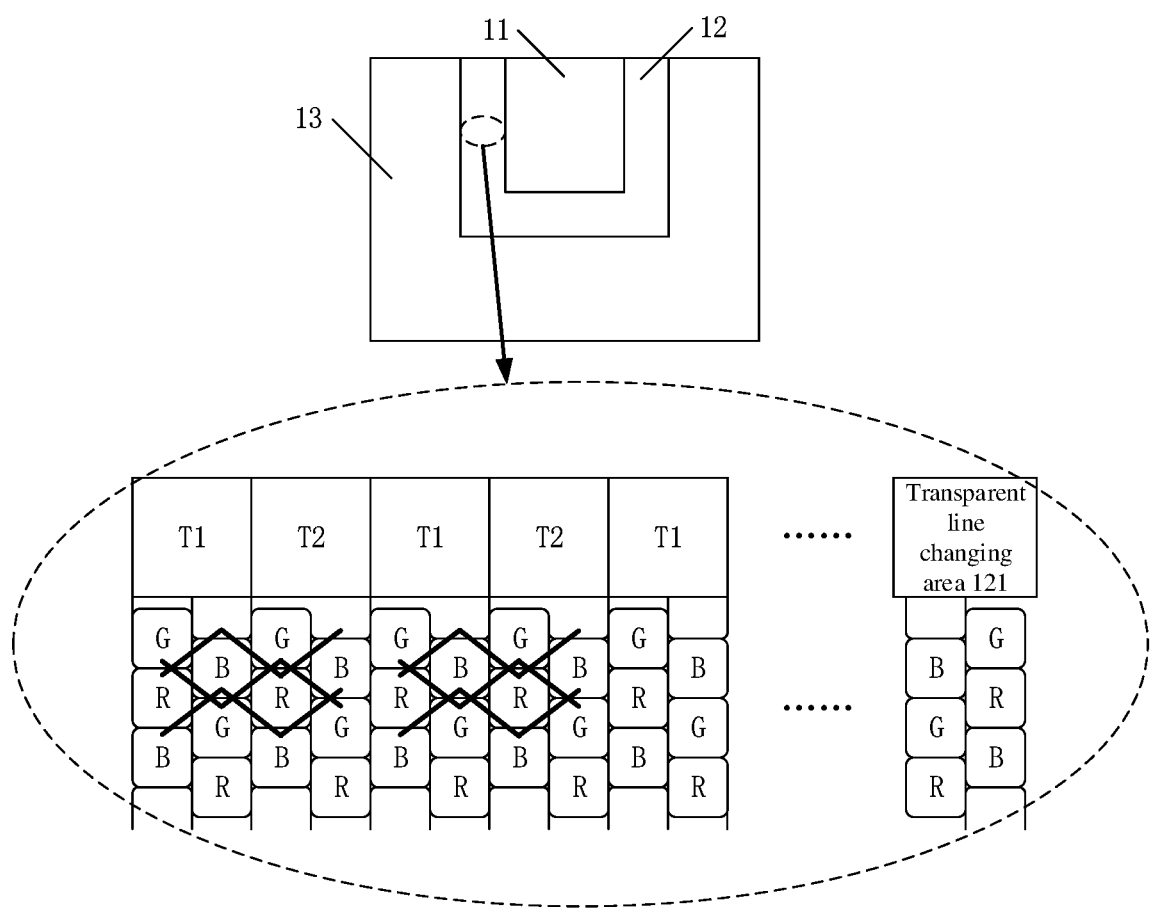
FIG. 2 is a partial schematic diagram of a pixel driving circuit in a display panel according to an embodiment of the present application.
Figure 3:
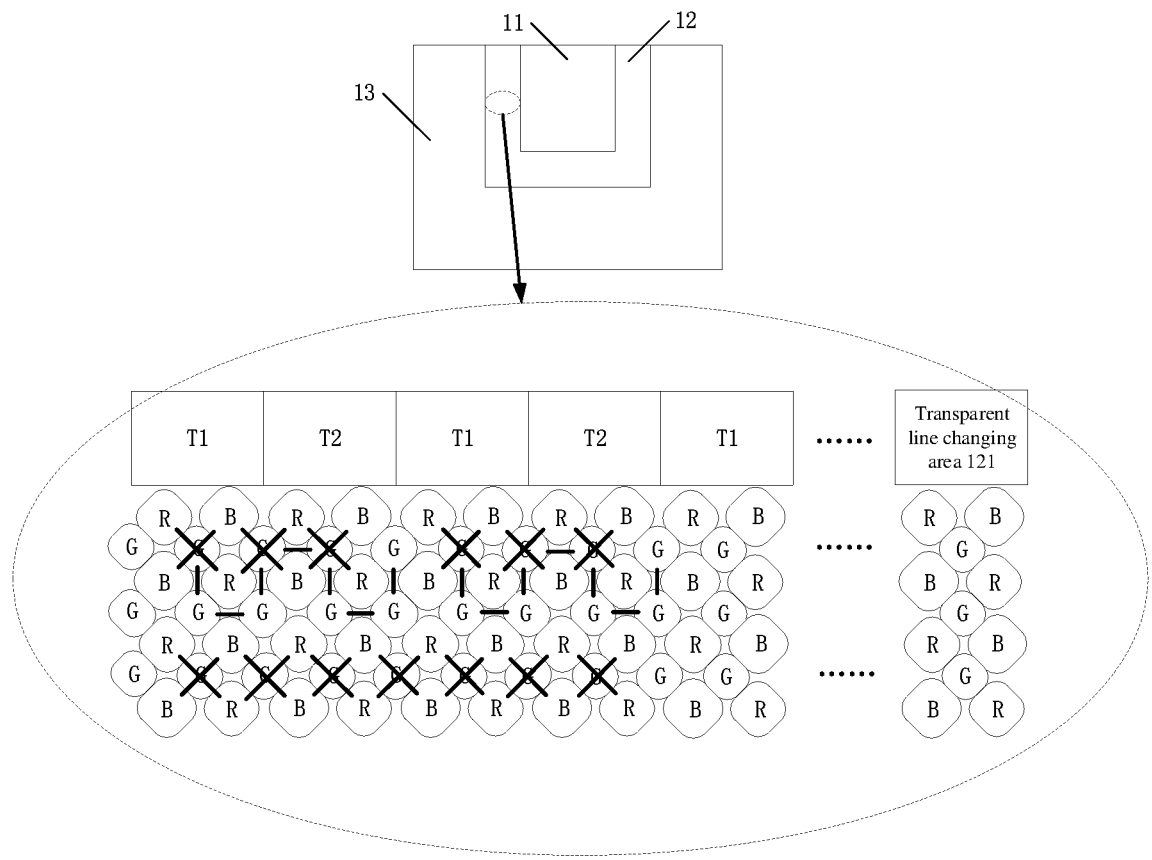
FIG. 3 is a partial schematic diagram of a pixel driving circuit in a display panel according to another embodiment of the present application.

As shown in FIG. 2 and FIG. 3, a first group T1 of driving transistors are a plurality of driving transistors for driving a plurality of pixel units disposed in the first display area 11, and a second group T2 of driving transistors are a plurality of driving transistors for driving a plurality of pixel units disposed in the second display area 12. The second display area 12 includes a plurality of first groups T1 of driving transistors and a plurality of second groups T2 of driving transistors arranged in a column direction. FIG. 2 and FIG. 3 only show some of the first groups T1 of driving transistors and some of the second groups T2 of driving transistors. The number and arrangement of the first groups T1 of driving transistors and the second groups T2 of driving transistors may be determined based on the number and arrangement of the pixel units disposed in the first display area 11 and the second display area 12, which is not limited herein.

The second groups T2 of driving transistors and the first groups T1 of driving transistors are alternately arranged, so that the number of the second groups T2 of driving transistors adjacent to each first group T1 of driving transistors is the same, and the position of the adjacent second groups T2 of driving transistors relative to each first group T1 of driving transistors is the same.

For example, as shown in FIG. 2 and FIG. 3, in a row of driving transistor groups, an order of the driving transistor groups is the second group T2 of driving transistors, the first group T1 of driving transistors, the second group T2 of driving transistors, the first group T1 of driving transistors, . . . , the second group T2 of driving transistors, the first group T1 of driving transistors. In a row of driving transistor groups, there is an adjacent second group T2 of driving transistors on each side of each first group T1 of driving transistors.

In the embodiment of the present application, a plurality of first groups of driving transistors and a plurality of second groups of driving transistors are arranged in a column direction and provided in the second display area 12 of the display panel. The second groups of driving transistors and the first groups of driving transistors are alternately arranged so that the surrounding environment of each driving transistor for driving the pixel unit in the first display area 11 is the same, and thus a parasitic capacitance of each driving transistor for driving the pixel unit in the first display area 11 tends to be the same or is the same, thereby reducing or eliminating the brightness difference in the first display area 11 and improving the display effect of the display panel. Moreover, the second groups of driving transistors are provided in the second display area 12. Since the driving transistors for driving the pixel units in the second display area 12 are positioned relatively close to the pixel units in the second display area 12, it is possible to save a wiring space and thus simplify a structure of the display panel.

In some embodiments, driving circuits including the second groups of driving transistors and driving circuits including the first groups of driving transistors are alternately arranged. The driving circuits may specifically be 1T circuits, 2T1C circuits, 3T1C circuits, 7T1C circuits, or 7T2C circuits, etc. Specific structures of the driving circuits are not limited herein.

In some embodiments, $N_1$ sub-pixels of the same color disposed in the first display area 11 are connected in series, that is, the $N_1$ sub-pixels connected in series may be simultaneously driven by one driving transistor. Specifically, the series connection of the $N_1$ sub-pixels of the same color can be realized by providing connecting lines connected to anodes of the $N_1$ sub-pixels. $N_1$ is an integer greater than or equal to 2. For example, eight sub-pixels of the same color in the first display area 11 are connected in series.

Figure 4:
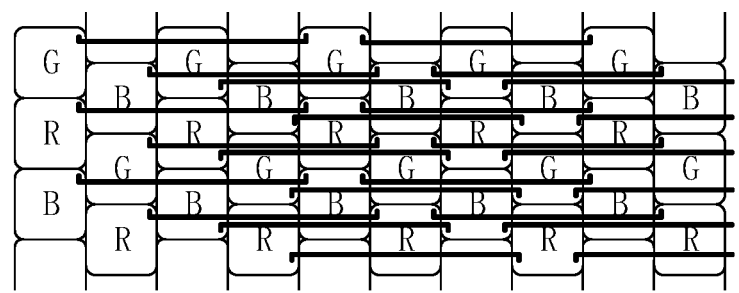
FIG. 4 is a schematic diagram of an example of series connection of sub-pixels in a part of a first display area.

The positions of the sub-pixels connected in series in the first display area 11 are not limited. For example, FIG. 4 is a schematic diagram of an example in which sub-pixels in a part of the first display area 11 are connected in series. As shown in FIG. 4, the sub-pixels include a green sub-pixel G, a red sub-pixel R, and a blue sub-pixel B, and in a pixel unit, the green sub-pixel G, the red sub-pixel R, and the blue sub-pixel B are arranged in a shape of "品" with 90° clockwise deflection. The sub-pixels emitting a same color are disposed in a plurality of rows, the sub-pixels in a row are disposed at intervals, and the first one and the third one of adjacent three of the sub-pixels in a row are connected with each other. The relatively dispersed sub-pixels of the same color are connected in series to make the brightness of the sub-pixels in the first display area 11 more even.

In some other examples, sub-pixels of the same color in adjacent $N_2$ pixel units disposed in the first display area 11 are connected in series. $N_2$ is an integer greater than or equal to 2. $N_2$ and $N_1$ may be the same or different, which is not limited herein.

Figure 5:
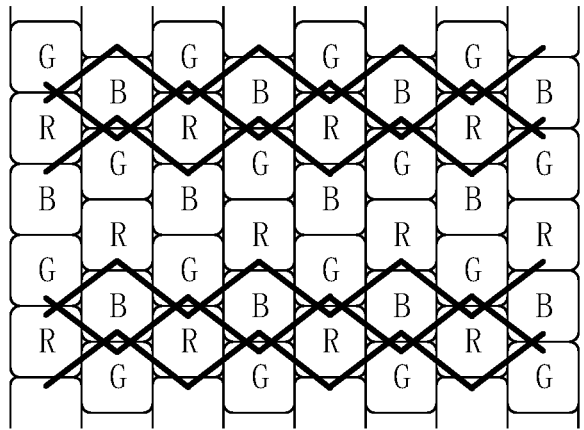
FIG. 5 is a schematic diagram of another example of series connection of sub-pixels in a part of a first display area.

As shown in FIG. 5, the sub-pixels include a green sub-pixel G, a red sub-pixel R, and a blue sub-pixel B, and in a pixel unit, the green sub-pixel G, the red sub-pixel R, and the blue sub-pixel B are arranged in a shape of "品" with 90° clockwise deflection, or the green sub-pixel G, the red sub-pixel R, and the blue sub-pixel B are arranged in a shape of "品" with 90° anti-clockwise deflection. Eight green sub-pixels G in eight adjacent pixel units are connected in series, eight red sub-pixels R in eight adjacent pixel units are connected in series, and eight blue sub-pixels B in eight adjacent pixel units are connected in series.

Figure 6:
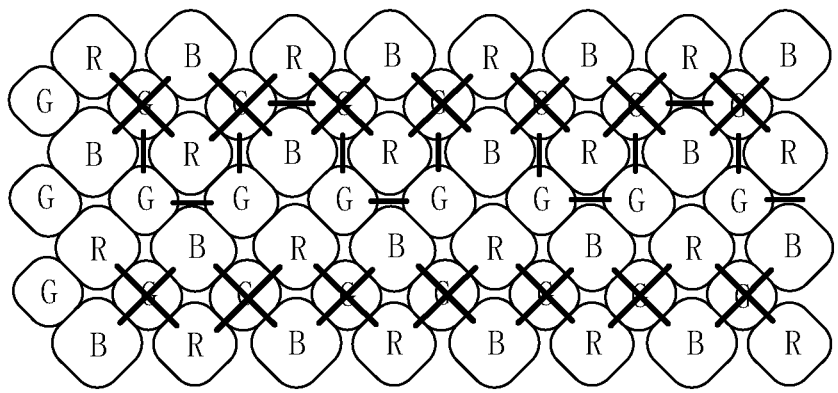
FIG. 6 is a schematic diagram of a further example of series connection of sub-pixels in a part of a first display area.

As shown in FIG. 6, the sub-pixels include a green sub-pixel G, a red sub-pixel R, and a blue sub-pixel B, and the green sub-pixel G, the red sub-pixel R, and the blue sub-pixel B are specifically arranged in a shape of Diamond. A pixel unit includes a green sub-pixel G, two red sub-pixels R and two blue sub-pixels B, and two adjacent pixel units in a row direction or a column direction share one red sub-pixel R and one blue sub-pixel B. Eight green sub-pixels G in eight adjacent pixel units are connected in series, eight red sub-pixels R in eight adjacent pixel units are connected in series, and eight blue sub-pixels B in eight adjacent pixel units are connected in series.

Similarly, in some other embodiments, $M_1$ sub-pixels of the same color disposed in the second display area 12 are connected in series, that is, the $M_1$ sub-pixels connected in series may be simultaneously driven by one driving transistor. Specifically, the series connection of the $M_1$ sub-pixels of the same color can be realized by using connecting lines to connect anodes of the $M_1$ sub-pixels. $M_1$ is an integer greater than or equal to 2. Four sub-pixels of the same color in the second display area 12 are connected in series.

The positions of the sub-pixels connected in series in the second display area 12 are not limited herein. For example, the sub-pixels of the same color in the second display area 12 may be connected in series as shown in FIG. 3, which will not be repeated here.

In some other examples, sub-pixels of the same color in adjacent $M_2$ pixel units in the second display area 12 are connected in series. $M_2$ is an integer greater than or equal to 2. $M_2$ and $M_1$ may be the same or different, which is not limited herein.

For example, the sub-pixels of the same color in the adjacent $M_2$ pixel units in the second display area 12 may be connected in series as shown in FIG. 2. The sub-pixels include a green sub-pixel G, a red sub-pixel R, and a blue sub-pixel B, and in a pixel unit, the green sub-pixel G, the red sub-pixel R, and the blue sub-pixel B are arranged in a shape of "品" with 90° clockwise deflection, or the green sub-pixel G, the red sub-pixel R, and the blue sub-pixel B are arranged in a shape of "品" with 90° anti-clockwise deflection. Four green sub-pixels G in four adjacent pixel units are connected in series, four red sub-pixels R in four adjacent pixel units are connected in series, and four blue sub-pixels B in four adjacent pixel units are connected in series.

For another example, the sub-pixels of the same color in the adjacent $M_2$ pixel units in the second display area 12 may be connected in series as shown in FIG. 3. The sub-pixels include a green sub-pixel G, a red sub-pixel R, and a blue sub-pixel B, and the green sub-pixel G, the red sub-pixel R, and the blue sub-pixel B are specifically arranged in a shape of Diamond. Four green sub-pixels G in four adjacent pixel units are connected in series, four red sub-pixels R in four adjacent pixel units are connected in series, and four blue sub-pixels B in four adjacent pixel units are connected in series.

It should be noted that the number of sub-pixels of the same color connected in series in the first display area 11 and the number of sub-pixels of the same color connected in series in the second display area 12 are independent of each other. $N_1$, $N_2$, $M_1$, and $M_2$ may be the same or different, which is not limited herein. The arrangement of the sub-pixels in the first display area 11 and the second display area 12 is not limited herein.

Connecting sub-pixels of the same color in series can reduce wiring and the wiring space and thus simplify the structure of the display panel. In the embodiments, the connecting lines may have a same material as the anodes and be formed in a same process with the anodes.

In some embodiments, the pixel unit includes a first sub-pixel, a second sub-pixel and a third sub-pixel, and the first sub-pixel, the second sub-pixel, and the third sub-pixel are sub-pixels of different colors. For example, the first sub-pixel, the second sub-pixel, and the third sub-pixel may be a green sub-pixel, a red sub-pixel, and a blue sub-pixel, respectively, which is not limited herein.

In the embodiments, the connecting lines are disposed in the second display area 12 and have overlaps with the driving transistors in the stacking direction. Specifically, a plurality of gate electrodes of the driving transistors of the first driving transistor groups have a plurality of overlaps with the connecting lines in the stacking direction and a plurality of first parasitic capacitances in the overlaps, a plurality of gate electrodes of the driving transistors of the second driving transistor groups have a plurality of overlaps with the connecting lines in the stacking direction and a plurality of second parasitic capacitances in the overlaps, and the first parasitic capacitances are the same as the second parasitic capacitances. Therefore, the potentials of the gate electrodes of the driving transistors in the first driving transistor groups are consistent with the potentials of the gate electrodes of the driving transistors in the second driving transistor groups, and the currents passing through the driving transistors in the first driving transistor groups and the second driving transistor groups are consistent, thereby ensuring that the display brightness in the first display area 11 and the second display area 12 is consistent.

A minimum repeating unit consists of adjacent two groups of the first driving transistor groups and the second driving transistor groups with the corresponding pixel units. A plurality of minimum repeating units are arranged in a periodicity.

For sake of illustration, the first driving transistor groups comprise a plurality of first driving transistors for driving the first sub-pixels disposed in the first display area 11, a plurality of second driving transistors for driving the second sub-pixels disposed in the first display area 11, and a plurality of third driving transistors for driving the third sub-pixels disposed in the first display area 11; the second driving transistor groups comprise a plurality of fourth driving transistors for driving the first sub-pixels disposed in the second display area 12, a plurality of fifth driving transistors for driving the second sub-pixels disposed in the second display area 12, and a plurality of sixth driving transistors for driving the third sub-pixels disposed in the second display area 12. The pixel units corresponding to the first driving transistors, the second driving transistors, the third driving transistors, the fourth driving transistors, the fifth driving transistors, and the sixth driving transistors are respectively defined as the first pixel units, the second pixel units, the third pixel units, the fourth pixel units, the fifth pixel units and the sixth pixel units. In the stacking direction, the first pixel units are disposed above the first driving transistors, the second pixel units are disposed above the second driving transistors, the third pixel units are disposed above the third driving transistors, the fourth pixel units are disposed above the fourth driving transistors, the fifth pixel units are disposed above the fifth driving transistors, and the sixth pixel units are disposed above the sixth driving transistors. In some examples, the first pixel unit, the second pixel unit and the third pixel unit may be same with each other, and the fourth pixel unit, the fifth pixel unit and the sixth pixel unit may be same with each other.

Specifically, the connecting lines passing through the first pixel units may be overlapped with the gate electrodes of the first driving transistors, the connecting lines passing through the second pixel units may be overlapped with the gate electrodes of the second driving transistors, the connecting lines passing through the third pixel units may be overlapped with the gate electrodes of the third driving transistors, the connecting lines passing through the fourth pixel units are overlapped with the gate electrodes of the fourth driving transistors, the connecting lines passing through the fifth pixel units are overlapped with the gate electrodes of the fifth driving transistors, and the connecting lines passing through the sixth pixel units are overlapped with the gate electrodes of the sixth driving transistors.

In other embodiments, the connecting lines passing through the pixel units and the gate electrodes of the corresponding pixel units may be not overlapped in the stacking direction, so as to prevent the connecting line from affecting the parasitic capacitance of the gate electrode of each drive transistor and ensure that the parasitic capacitance of the gate electrode of each drive transistor is the same or tends to be the same.

Furthermore, a via of the gate electrode of each driving transistor in the first driving transistor groups has a first projection on a corresponding pixel unit, and the positions of the first projections are the same with each other; a via of the gate electrode of each driving transistor in the second driving transistor groups has a second projection on a corresponding pixel unit, and the positions of the second projections are the same with each other; and the positions of the first projections are the same with the positions of the second projections. Such a configuration further ensures that the first parasitic capacitance and the second parasitic capacitance are the same or tend to be the same, thereby reducing or eliminating the brightness difference between the first display area 11 and the second display area 12, and further improving the display effect of the display panel.

Figure 7:
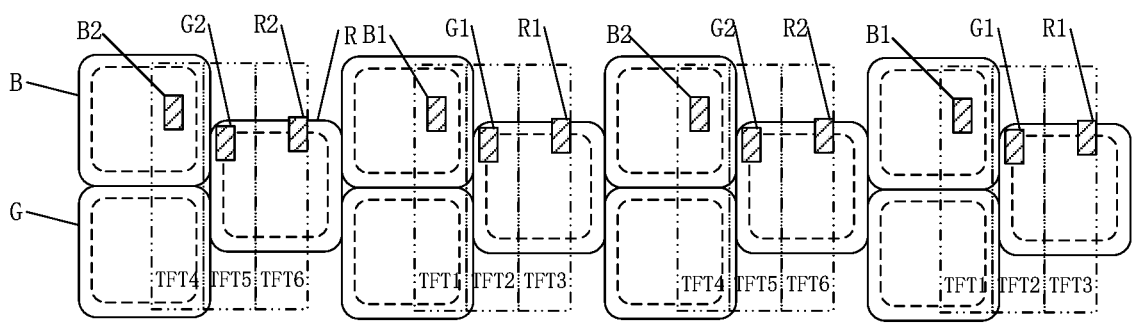
FIG. 7 is a schematic diagram showing positions of examples of driving transistors and pixel units in a part of a display panel.

Referring to FIG. 7, FIG. 7 shows four pixel units respectively corresponding to the second group of driving transistors, the first group of driving transistors, the second group of driving transistors, and the first group of driving transistors in an order from left to right. Each pixel unit includes a blue sub-pixel B, a green sub-pixel G, and a red sub-pixel R. The first groups T1 of driving transistors include the first driving transistors TFT1 for driving the blue sub-pixels B disposed in the first display area 11, the second driving transistors TFT2 for driving the green sub-pixels G disposed in the first display area 11, and the third driving transistors TFT3 for driving the red sub-pixels R disposed in the first display area 11. The second groups T2 of driving transistors include the fourth driving transistors TFT4 for driving the blue sub-pixels B disposed in the second display area 12, the fifth driving transistors TFT5 for driving the green sub-pixels G disposed in the second display area 12, and the sixth driving transistors TFT6 for driving the red sub-pixels R disposed in the second display area 12.

As shown in FIG. 7, the position of the projection B1 of the gate via of the first driving transistor TFT1 corresponding to the second pixel unit on the second pixel unit and the position of the projection B1 of the gate via of the first driving transistor TFT1 corresponding to the fourth pixel unit on the fourth pixel unit are the same; the position of the projection G1 of the gate via of the second driving transistor TFT2 corresponding to the second pixel unit on the second pixel unit and the position of the projection G1 of the gate via of the second driving transistor TFT2 corresponding to the fourth pixel unit on the fourth pixel unit are the same; the position of the projection R1 of the gate via of the third driving transistor TFT3 corresponding to the second pixel unit on the second pixel unit and the position of the projection R1 of the gate via of the third driving transistor TFT3 corresponding to the fourth pixel unit on the fourth pixel unit are the same. The position of the projection B2 of the gate via of the fourth driving transistor TFT4 corresponding to the first pixel unit on the first pixel unit and the position of the projection B2 of the gate via of the fourth driving transistor TFT4 corresponding to the third pixel unit on the third pixel unit are the same; the position of the projection G2 of the gate via of the fifth driving transistor TFT5 corresponding to the first pixel unit on the first pixel unit and the position of the projection G2 of the gate via of the fifth driving transistor TFT5 corresponding to the third pixel unit on the third pixel unit are the same; the position of the projection R2 of the gate via of the sixth driving transistor TFT6 corresponding to the first pixel unit on the first pixel unit and the position of the projection R2 of the gate via of the sixth driving transistor TFT6 corresponding to the third pixel unit on the third pixel unit are the same.

Furthermore, in combination with the arrangement of the sub-pixels in the pixel unit, it is possible to make the positions of the projections of the gate vias of the driving transistors for driving the pixel units disposed in the first display area 11 and the second display area 12 on the corresponding pixel units to be the same, so that the first parasitic capacitances and the second parasitic capacitances at the gate electrodes of the driving transistors for driving the pixel units disposed in the first display area 11 and the second display area 12 tend to be the same or are the same, thereby further reducing or eliminating the brightness difference in the first display area 11 and the second display area 12 and improving the display effect of the display panel.

Figure 8:
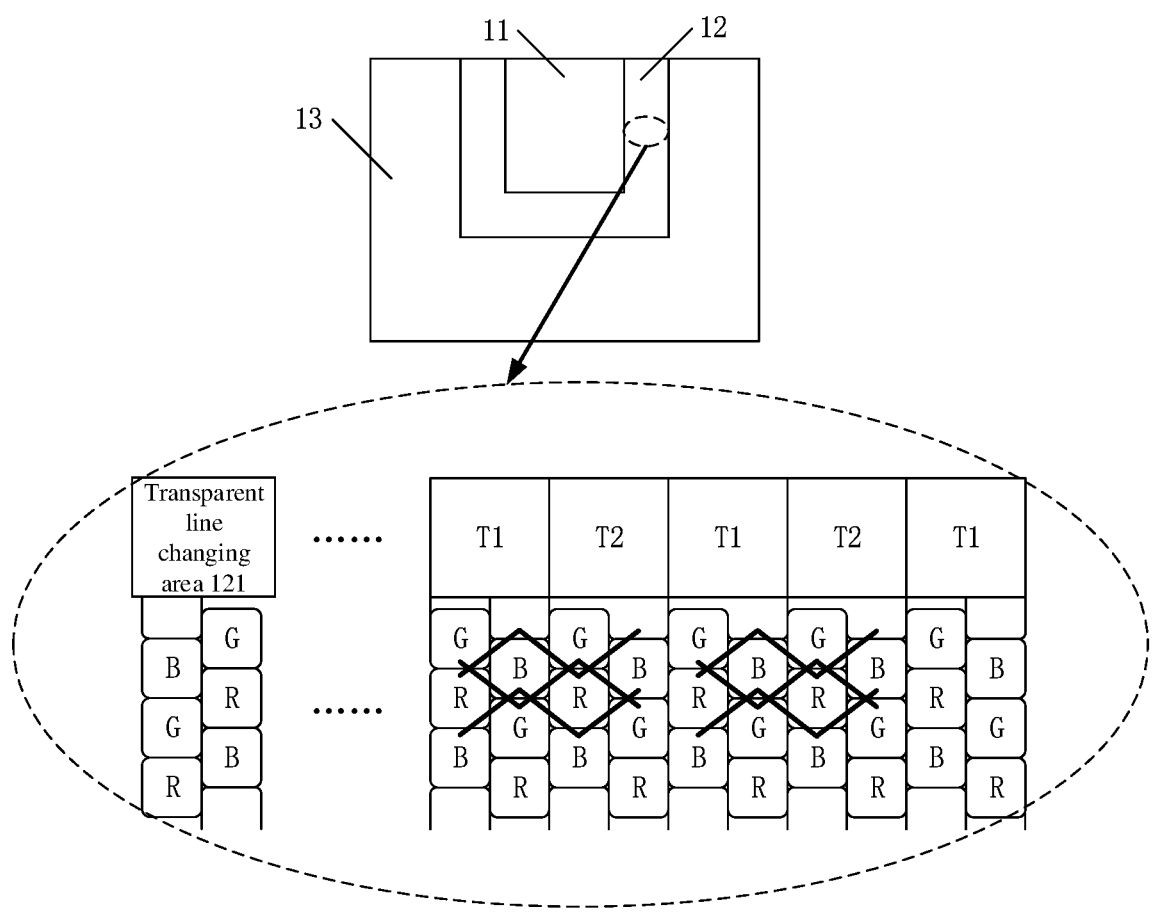
FIG. 8 is a partial schematic diagram of a pixel driving circuit in a display panel according to a further embodiment of the present application.

In some examples, the alternately arranged second groups T2 of driving transistors and first groups T1 of driving transistors may be arranged in a row. For the second groups T2 of driving transistors and the first groups T1 of driving transistors alternately arranged in each row, the arrangement direction may be from a side of the second display area 12 away from the first display area 11 to a side of the second display area 12 close to the first display area 11. As shown in FIG. 2 and FIG. 8, for each row of driving transistors in the left part of the second display area 12, the driving transistors are arranged in a direction from the side of the second display area 12 away from the first display area 11 to the side of the second display area 12 close to the first display area 11, that is, the driving transistors are arranged in a direction from left to right. For each row of drive transistors in the right part of the second display area 12, the drive transistor are arranged in a direction from the side of the second display area 12 away from the first display area 11 to the side of the second display area 12 close to the first display area 11, that is, the driving transistors are arranged in a direction from right to left.

The display panel also includes a transparent connection line for connecting the first pixel unit and the driving transistor for driving the first pixel unit. The transparent connection line is provided in a transparent line changing area 121 located on the side of the second display area 12 close to the first display area 11. That is, the transparent line changing area 121 is provided at the end of each row of driving transistors in the second display area 12, and the transparent connecting line for connecting the first pixel unit and the driving transistor for driving the first pixel unit is provided in the transparent line changing area 121.

In some embodiments, aperture ratios and pixel arrangement rules of the pixel units in the first display area 11, the second display area 12 and the third display area 13 are consistent. Specifically, parts of a high-precision metal mask (Fine Metal Mask, FMM) respectively corresponding to the first display area 11, the second display area 12, and the third display area 13 may be unified to have an opening of one size. On the one hand, difficulty of making FMM may be reduced; on the other hand, pixel density and display accuracy of the first display area 11 may also be improved.

Figure 9:
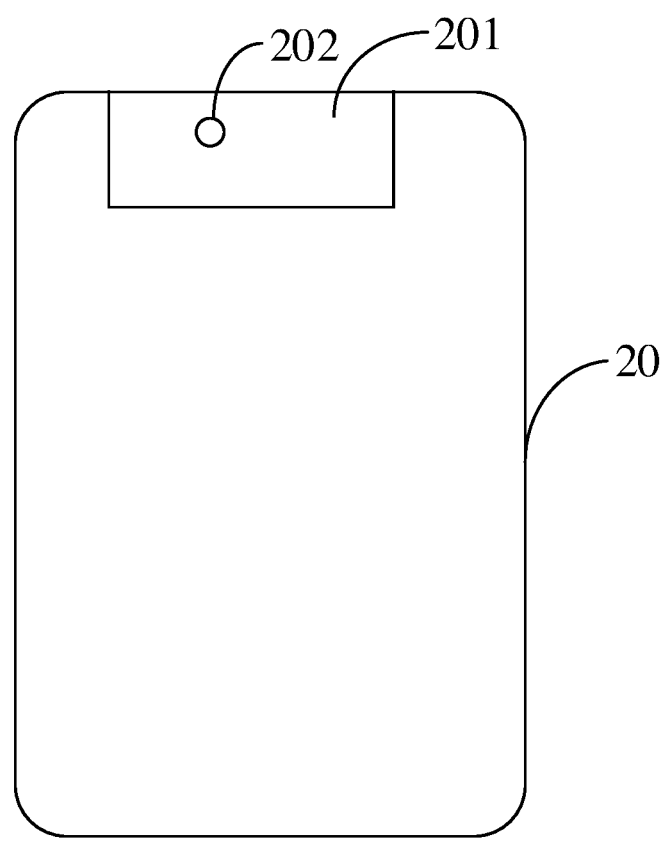
FIG. 9 is a schematic diagram of an apparatus body of a display apparatus according to an embodiment of the present application.

An embodiment of the present application also provides a display apparatus. The display apparatus includes an apparatus body and the display panel in the above-described embodiments. As shown in FIG. 9, the apparatus body 20 includes a device area 201, and the display panel covers the apparatus body 20. The device area 201 is located under the first display area, and the device area 201 is provided with a photosensitive device 202 for light collection through the first display area.

As an example, the photosensitive device 202 may include a camera and/or a light sensor. In the device area 201, devices other than the photosensitive device 202, such as a gyroscope or an earpiece, can also be arranged. The device area 201 may be a grooved area, and the first display area of the display panel may be arranged to fit the grooved area so that the photosensitive device can emit or collect light through the first display area.

Examples of the above-described display apparatus may be a digital device such as a mobile phone, a tablet, a handheld computer, and an IPAD.

What is claimed is:

1. A display panel, comprising:
    a first display area;
    a second display area; and
    a third display area, wherein the second display area surrounds at least a part of the first display area and is located between the first display area and the third display area, a light transmittance of the first display area is higher than a light transmittance of the second display area and a light transmittance of the third display area;
    a plurality of pixel units, located in the first display area, the second display area and the third display area and having a plurality of sub-pixels;
    a plurality of first driving transistor groups, disposed in the second display area and having a plurality of driving transistors for driving the pixel units disposed in the first display area; and
    a plurality of second driving transistor groups, disposed in the second display area and having a plurality of driving transistors for driving the pixel units disposed in the second display area;
    the second driving transistor groups and the first driving transistor groups are alternately arranged; and wherein $M_1$ sub-pixels emitting a same color disposed in the second display area are connected in series via a connecting line and connected to a same driving transistor disposed in the second display area; wherein $M_1$ is an integer greater than or equal to 2;
    the connecting line is overlapped with the driving transistor disposed in the second display area along a stacking direction.

2. The display panel of claim 1, further comprising a plurality of minimum repeating units consisting of adjacent two groups of the first driving transistor groups and the second driving transistor groups with the corresponding pixel units, wherein the minimum repeating units are arranged in a periodicity.

3. The display panel of claim 1, wherein the connecting line disposed in the second display area is connected with an anode of the corresponding sub-pixel disposed in the second display area, and the connecting line has a same material as said anode and is formed in a same process with said anode.

4. The display panel of claim 3, wherein a plurality of gate electrodes of the driving transistors of the first driving transistor groups have a plurality of overlaps with the connecting lines in the stacking direction and a plurality of first parasitic capacitances in the overlaps, a plurality of gate electrodes of the driving transistors of the second driving transistor groups have a plurality of overlaps with the connecting lines in the stacking direction and a plurality of second parasitic capacitances in the overlaps, and the first parasitic capacitances are same as the second parasitic capacitances.

5. The display panel of claim 4, wherein a via of the gate electrode of each driving transistor in the first driving transistor groups has a first projection on a corresponding pixel unit, and the positions of the first projections are the same with each other;
    a via of the gate electrode of each driving transistor in the second driving transistor groups has a second projection on a corresponding pixel unit, and the positions of the second projections are the same with each other; and
    the positions of the first projections are the same with the positions of the second projections.

6. The display panel of claim 5, wherein the sub-pixels of the pixel units disposed in the first display area comprise a plurality of first sub-pixels, a plurality of second sub-pixels and a plurality of third sub-pixels;
    the first driving transistor groups comprise a plurality of first driving transistors for driving the first sub-pixels, a plurality of second driving transistors for driving the second sub-pixels and a plurality of third driving transistors for driving the third sub-pixels;
    the pixel units corresponding to the first driving transistors, the second driving transistors and the third driving transistors are respectively defined as first pixel units, second pixel units and third pixel units;
    in the stacking direction, the first pixel units are disposed above the first driving transistors, the second pixel units are disposed above the second driving transistors, and the third pixel units are disposed above the third driving transistors.

7. The display panel of claim 6, wherein in the stacking direction,
    the positions of the first projections of the vias of the gate electrodes of the first driving transistors on corresponding first pixel units are the same with each other,
    the positions of the first projections of the vias of the gate electrodes of the second driving transistors on corresponding second pixel units are the same with each other, and
    the positions of the first projections of the vias of the gate electrodes of the third driving transistors on corresponding third pixel units are the same with each other.

8. The display panel of claim 7, wherein in the stacking direction,
    the connecting lines passing through the first pixel units are overlapped with the gate electrodes of the first driving transistors, the connecting lines passing through the second pixel units are overlapped with the gate electrodes of the second driving transistors, and the connecting lines passing through the third pixel units are overlapped with the gate electrodes of the third driving transistors.

9. The display panel of claim 6, wherein the sub-pixels of the pixel units disposed in the second display area comprise a plurality of first sub-pixels, a plurality of second sub-pixels and a plurality of third sub-pixels;
    the second driving transistor groups comprise a plurality of fourth driving transistors for driving the first sub-pixels disposed in the second display area, a plurality of fifth driving transistors for driving the second sub-pixels disposed in the second display area and a plurality of sixth driving transistors for driving the third sub-pixels disposed in the second display area;
    the pixel units corresponding to the fourth driving transistors, the fifth driving transistors and the sixth driving transistors are respectively defined as fourth pixel units, fifth pixel units and sixth pixel units;
    in the stacking direction, the fourth pixel units are disposed above the fourth driving transistors, the fifth pixel units are disposed above the fifth driving transistors, and the sixth pixel units are disposed above the sixth driving transistors.

10. The display panel of claim 9, wherein in the stacking direction,
the positions of the second projections of the vias of the gate electrodes of the fourth driving transistors on corresponding fourth pixel units are the same with each other,
the positions of the second projections of the vias of the gate electrodes of the fifth driving transistors on corresponding fifth pixel units are the same with each other, and
the positions of the second projections of the vias of the gate electrodes of the sixth driving transistors on corresponding sixth pixel units are the same with each other.

11. The display panel of claim 10, wherein in the stacking direction,
the connecting lines passing through the fourth pixel units are overlapped with the gate electrodes of the fourth driving transistors, the connecting lines passing through the fifth pixel units are overlapped with the gate electrodes of the fifth driving transistors, and the connecting lines passing through the sixth pixel units are overlapped with the gate electrodes of the sixth driving transistors.

12. The display panel of claim 9, wherein the first pixel unit, the second pixel unit and the third pixel unit are same with each other and the fourth pixel unit, the fifth pixel unit and the sixth pixel unit are same with each other.

13. The display panel of claim 6, further comprising a plurality of transparent connection lines for connecting the first pixel units with the driving transistors driving the first pixel units, and the transparent connection lines are provided in a transition area located on a side of the second display area close to the first display area.

14. The display panel of claim 1, wherein the sub-pixels emitting a same color in adjacent $M_2$ pixel units in the second display area are connected in series, and $M_2$ is an integer greater than or equal to 2.

15. The display panel of claim 1, wherein $N_1$ sub-pixels emitting a same color in the first display area are connected in series, and $N_1$ is an integer greater than or equal to 2.

16. The display panel of claim 15, wherein the $N_1$ sub-pixels emitting a same color in the first display area are disposed in a plurality of rows, the sub-pixels in a row are disposed at intervals, and the first one and the third one of adjacent three of the sub-pixels in a row are connected with each other.

17. The display panel of claim 15, wherein sub-pixels of a same color in $N_2$ adjacent pixel units in the first display area are connected in series, and $N_2$ is an integer greater than or equal to 2.

18. The display panel of claim 1, wherein
aperture ratios and pixel arrangement rules of the pixel units in the first display area, the second display area and the third display area are consistent.

19. A display apparatus, comprising:
an apparatus body comprising a device area;
the display panel of claim 1,
wherein the display panel covers the apparatus body, the device area is located under the first display area, and a photosensitive device for emitting or collecting light through the first display area is provided in the device area.

20. A display panel, comprising:
a first display area;
a second display area; and
a third display area, wherein the second display area surrounds at least a part of the first display area and is located between the first display area and the third display area, a light transmittance of the first display area is higher than a light transmittance of the second display area and a light transmittance of the third display area;
a plurality of pixel units, located in the first display area, the second display area and the third display area and having a plurality of sub-pixels;
a plurality of first driving transistor groups, disposed in the second display area and having a plurality of driving transistors for driving the pixel units disposed in the first display area; and
a plurality of second driving transistor groups, disposed in the second display area and having a plurality of driving transistors for driving the pixel units disposed in the second display area;
the second driving transistor groups and the first driving transistor groups are alternately arranged, aperture ratios and pixel arrangement rules of the pixel units in the first display area, the second display area and the third display area are consistent.

\* \* \* \* \*